United States Patent [19]

Goossen

[11] Patent Number: 5,329,136
[45] Date of Patent: Jul. 12, 1994

[54] VOLTAGE-TUNABLE PHOTODETECTOR

[75] Inventor: Keith W. Goossen, Aberdeen, N.J.

[73] Assignee: AT&T Bell Laboratories, Murray Hill, N.J.

[21] Appl. No.: 56,374

[22] Filed: Apr. 30, 1993

[51] Int. Cl.$^5$ .............................................. H01L 27/14
[52] U.S. Cl. ...................................... 257/17; 257/21; 257/22; 257/184; 257/458
[58] Field of Search ................. 257/21, 440, 443, 622, 257/15, 17, 22, 458, 184; 307/311

[56] References Cited

U.S. PATENT DOCUMENTS

| | | | |
|---|---|---|---|
| 4,205,331 | 5/1980 | Esaki et al. | 257/21 |
| 4,711,857 | 12/1987 | Cheng | 257/21 X |
| 5,023,685 | 6/1991 | Bethea et al. | 257/21 |
| 5,144,397 | 9/1992 | Tokuda et al. | 257/432 |
| 5,229,878 | 7/1993 | Tomita et al. | 257/21 X |

FOREIGN PATENT DOCUMENTS 2228824 9/1990 United Kingdom ............... 257/440

OTHER PUBLICATIONS

Larsson et al., "Photon-Assisted Resonant Tunneling Through Variably Spaced Superlattice Energy Filters", Appl. Phys. Lett. 58(12), Mar. 25, 1991, pp. 1297–1298.
Tokuda et al., "Dual-Wavelength Multiple Quantum Well N-I-P-I-N Photodetector Using an Optically Bistable Abrupt Absorption Edge", Appl. Phys. Lett. 56(3), Jan. 15, 1990, pp. 227–228.
Wood et al., "Wavelength-selective voltage-tunable photodetector made from multiple quantum wells," Appl. Phys. Lett., vol. 47 No. 3, Aug. 1, 1985, pp. 190–192.
Larsson et al., "Tunable Superlattice p-i-n Photodectors: Characteristics, Theory, and Applications," IEEE Journal of Quantum Electronics, vol. 24, No. 5, May 1988, pp. 787–801.

*Primary Examiner*—William Mintel

[57] ABSTRACT

A tunable monolithic integrated photodetector (10) detects a selected wavelength of incident light within a wavelength range. The photodetector comprises a multiple quantum well (MQW) filter means for receiving and filtering the incident light, and an MQW detector means for receiving light from the MQW filter means and for detecting the selected wavelength. A fixed voltage bias $V_A$ is disposed between the filter means and the detector means for causing the filter means to absorb light wavelengths around the selected wavelength to thereby enhance the detectability of the selected wavelength. Further, a variable voltage bias $V_P$ is selectively and proportionally imposed on both the filter means and the detector means for permitting tuning of the photodetector. A fixed filter may also be employed for filtering the incident light so that light wavelengths which are outside the range of the photodetector are eliminated. Finally, a plurality of the photodetectors may be arranged in a two dimensional array for image processing.

23 Claims, 4 Drawing Sheets

VOLTAGE-TUNABLE PHOTODETECTOR

FIELD OF THE INVENTION

The present invention generally relates to monolithic integrated circuit technology and electromagnetic communication technology and, more particularly, to a tunable monolithic integrated photodetector for detecting light at a selected wavelength within a wavelength range.

BACKGROUND OF THE INVENTION

When light strikes a photosensitive material, light energy, or photons, are absorbed by the material, and an electrical current, often called a photocurrent because it results from the absorption of photons, is generated in the material. Photocurrent refers to the flow of electrons or holes within the material. Moreover, a peak in the photocurrent spectrum of the material which results from the absorption of photons is oftentimes referred to as an exciton.

In the prior art, it has been shown that a multiple quantum well (MQW) diode can be used as a photodetector whose voltage of maximum photocurrent, i.e., a large exciton, is dependent upon the wavelength of incident light. In this regard, see P. H. Wood et al., "Wavelength-Selective Voltage-Tunable Photodetector Made from Multiple Quantum Wells," *Appl. Phys. Lett.*, vol. 47, no. 3, pp. 190-192, Aug. 1, 1985. An MQW material is essentially a narrow bandgap material which has a thickness substantially less than the diameter of an exciton and which is sandwiched between wider bandgap materials so as to enhance the exciton via confinement of the energy potential well. The voltage of maximum photocurrent within the MQW diode can be located and related to the wavelength of the incident light, thereby allowing for measurements of the wavelength. Identifying the wavelength of incident light is beneficial in imaging and spectroscopy applications.

However, the light incident on a photosensitive material can create multiple peaks in the photocurrent spectrum, that is, more than one exciton. The photocurrent exhibits a relatively large exciton, called a heavy hole (hh) exciton, at the particular wavelength of incident light, as well as any number of smaller excitons, called light hole (lh) excitons, at other wavelengths of the photocurrent spectrum. Needless to say, the occurrence of multiple excitons causes potential ambiguity when one attempts to determine the wavelength of incident light.

More specifically, at room temperature (i.e., approximately 300 degrees Kelvin), the selectivity of an MQW diode is step-like, producing photocurrent at all photon wavelengths at and above the exciton wavelength. If no electrical bias is applied to the MQW diode, the peak-to-valley ratio of the hh exciton to the lh exciton is typically about 1.3 to 1 and reduces considerably with applied bias. See A. M. Fox et al., "Quantum Well Carrier Sweep Out; Relation to Electroabsorption and Exciton Saturation," *IEEE Journal of Quantum Electronics*, vol. 27, p. 2281 (1991). As the foregoing ratio is reduced, the lh excitons become indistinguishable from the hh excitons. With a 10 V/$\mu$m bias, the photocurrent peak at the lh exciton is actually larger than the peak at the hh exciton and occurs at the same wavelength as the hh exciton at 0 V/$\mu$m bias.

Thus, a heretofore unaddressed need exists in the industry for a tunable monolithic photodetector for detecting light at a selected wavelength within a wavelength range and which does not suffer from the problems and deficiencies of the prior art, as noted in the foregoing.

SUMMARY OF THE INVENTION

Briefly described, the present invention is a tunable monolithic integrated photodetector for detecting light at a selected wavelength within a wavelength range. The photodetector comprises a filter means, a detector means, and a bias means. Both the filter means and the detector means are formed from multiple quantum well (MQW) materials which are monolithically integrated atop a substrate. The filter means (first MQW layer) receives and filters incident light, and the detector means (second MQW layer) receives light from the filter means and detects the selected wavelength. The bias means applies a fixed bias and a variable bias. The fixed bias is applied between the filter means and the detector means for the purpose of causing the filter means to absorb light wavelengths surrounding the selected wavelength, thereby enhancing the detectability of the selected wavelength by the detector means. The variable bias is applied proportionally to both the filter means and the detector means for specifying, in effect, the selected wavelength within the tunable range.

A fixed filter may also be implemented for filtering out wavelengths of incident light beyond the tunable range of the photodetector. Optimal selectivity is achieved utilizing the fixed filter in combination with the photodetector.

In accordance with another embodiment of the present invention, a plurality of photodetectors formed in accordance with the present invention may be situated in a plane to form a two-dimensional array. The array of photodetectors may be used for many purposes, including imaging applications.

Other objections, features, and advantages of the present invention will become apparent to one of skill in the art upon examination of the following drawings and detailed description.

BRIEF DESCRIPTION OF THE DRAWINGS

The present invention can be better understood with reference to the following drawings. The drawings are not necessarily to scale, emphasis instead being placed upon clearly illustrating principles of the present invention.

DETAILED DESCRIPTION OF THE PREFERRED EMBODIMENT

Figure 1:
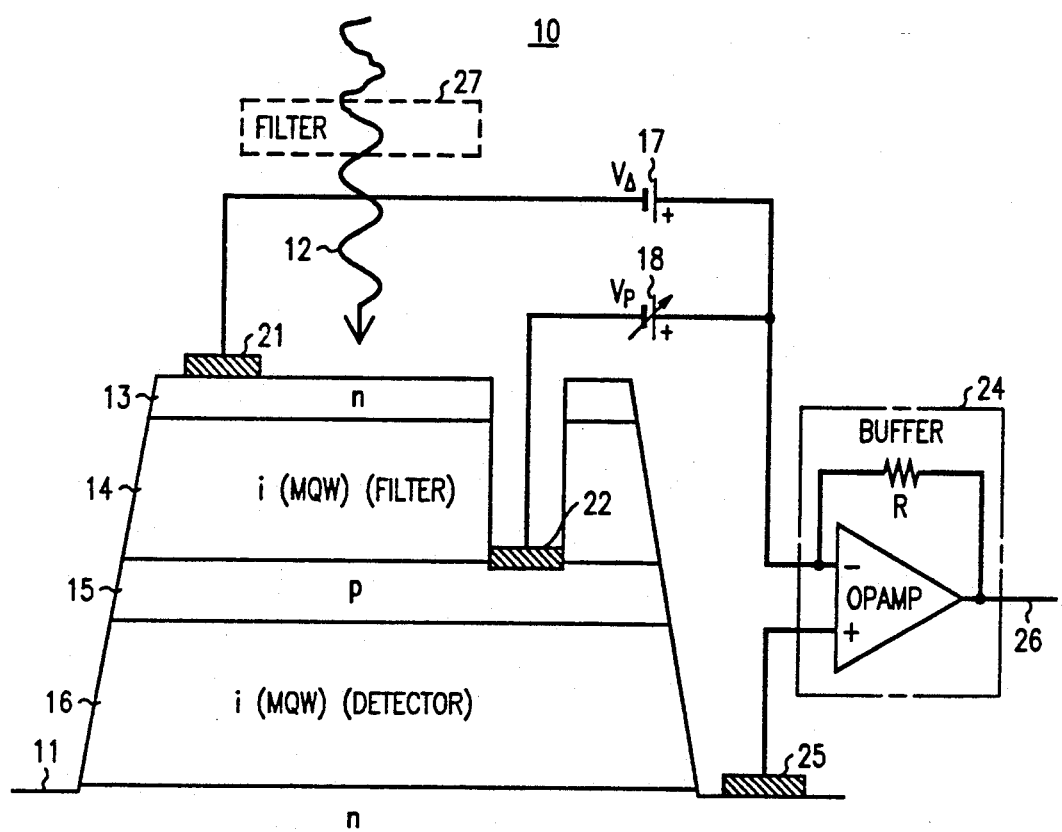
FIG. 1 is a schematic view of a monolithic integrated photodetector in accordance with the present invention.

With reference to FIG. 1, a monolithic integrated photodetector 10 residing on a substrate 11 can determine the wavelength of incident light 12. The monolithic integrated photodetector 10 is preferably a n-i(MQW)-p-i(MQW)-n device with independent contacts to each of the p and n doped layers. Specifically, referring to FIG. 1, the photodetector 10 comprises the following successive layers: an n-doped layer 13, an intrinsic MQW layer 14 serving as a filter means, a p-doped layer 15, an intrinsic second MQW layer 16 serving as a detector means for detecting the wavelength of the incident light 12, and the n-doped substrate 11.

A fixed voltage bias $V_\Delta$ is applied between the MQW filter means 14 and the MQW detector means 16 via a fixed voltage source 17 of FIG. 1. As illustrated in FIG. 1, the voltage source 17 is connected between a contact 21 on the top surface of the n-doped layer 13 and a buffer 24, which will be described in further detail hereinafter. The fixed voltage bias $V_\Delta$ causes the MQW filter means 14 to absorb light wavelengths substantially surrounding the selected wavelength to thereby enhance the detectability of the selected wavelength. By offsetting the bias $V_\Delta$ of the MQW filter means 14 with respect to the MQW detector 16, the photocurrent spectrum of the MQW detector means 16 is slightly shifted compared to that of the MQW filter means 14. This predicament creates a narrow wavelength region where detectability is maximized, thus closely approximating a single wavelength, voltage tunable photodetector.

A variable voltage bias $V_P$ is proportionally applied by a variable voltage source 18 across both the MQW filter means 14 and MQW detector means 16. As illustrated in FIG. 1, the voltage source 18 is connected between a contact 22 and the buffer 24. The contact 22 is situated in a well through the n-doped layer 13 and MQW filter means 14 to the p-doped layer 15. As the voltage bias $V_P$ is varied, the photodetector 10 is tuned. In other words, as the voltage bias $V_P$ is varied, the wavelength at which the MQW detector means 16 will exhibit a heavy hole exciton from the incident light 12 is varied.

The buffer 24, preferably a current preamplifier having resistor R and operational amplifier OPAMP, is connected to the positive terminals of the voltage sources 17, 18 and to the substrate 11 via contact 25 in order to provide a photodetector output 26. Photocurrent generated in the MQW filter means 14 does not flow through the buffer 24, but rather is shunted through the voltage sources 17, 18.

In the preferred embodiment, the photodetector 10 is formed on an n-doped GaAs substrate 11 using GaAs-source molecular beam epitaxy. First, 0.5 $\mu$m of n-doped $Al_{0.3}Ga_{0.7}As$ is formed on the GaAs substrate 11. Next, the MQW detector means 16 is formed on the foregoing layer. The MQW detector 16 preferably comprises 75 undoped periods of 95 Å GaAs wells and 45 Å $Al_{0.3}Ga_{0.7}As$ barriers. The MQW detector means 16 is then clad with 200 Å $Al_{0.3}Ga_{0.7}As$ spacers on both sides. A 0.8 $\mu$m p-doped $Al_{0.3}Ga_{0.7}As$ layer 15 is formed on the MQW detector means 16. Next, the MQW filter means 14 is formed on the doped layer 15. The MQW filter means 14 preferably comprises 71 undoped periods of 95 Å GaAs wells and 45 Å $Al_{0.3}Ga_{0.7}As$ barriers. The MQW filter means 14 is clad with 200 Å $Al_{0.3}Ga_{0.7}As$ undoped spacers. Finally, a 0.6 $\mu$m $Al_{0.3}Ga_{0.7}As$ n-doped layer 13 is formed on the MQW filter means 14, followed by a 50 Å n+doped GaAs cap layer. The MQW filter means 14 has less periods than the MQW detector means 16 so that the MQW filter means 14 red shifts faster with voltage and thus tends to maintain the difference of the red shifts of the filter means 14 and the detector means 16 constant if the fixed voltage bias $V_\Delta$ is kept fixed. Otherwise, the difference would not increase proportionally because the red shift is quadratic with respect to field strength. A "red shift" in the context of this document means a shift in the photocurrent spectrum of a material, and thus, a change in the photon energy for generating excitons. With the preceding configuration, tunability is achieved by varying only the bias $V_P$ supplied by voltage source 18.

It should be noted that the fixed voltage source 17 for supplying the fixed voltage bias $V_\Delta$ could be replaced by a variable voltage source. In this event, the MQW filter means 14 would not need to have less periods than the MQW detector means 16. However, more than one voltage source would need to be adjusted in order to tune the photodetector 10, thus making this circuit configuration undesirable. Moreover, it should be noted that with the preceding configuration, there is still a fixed bias between the filter means 14 and the detector means 16 and that tuning is accomplished while still maintaining this relative fixed bias.

Next, a AuGe layer is placed photolithographically on the n-doped layer 13 to form the contact 21. Further, a self-aligned technique is used to place the contact 22 within the well 23 on the p-doped layer 15. The reason for using a self-aligned technique is that care must be taken to avoid exposing regions of the MQW detector means 16 to light which is unfiltered by the MQW filter means 14. In the self-aligned technique, openings are defined in a layer of photoresist, and the sample is etched through the photoresist layer to the p-doped layer 15. An AuZn layer is then deposited onto the p-doped layer 15 using the same photoresist mask for the lift-off in order to form the contact 22. Thus, the entire etched region is coated with metal, as illustrated in FIG. 1. Because the contact 22 is deposited using the foregoing procedure, the photodetector 10 functions without having to focus the incident light 12 on any particular area of the n-doped layer 13. Finally, a mesa configuration for the photodetector 10 is formed by etching the structure down to the bottom n-doped substrate 11.

Figure 2:
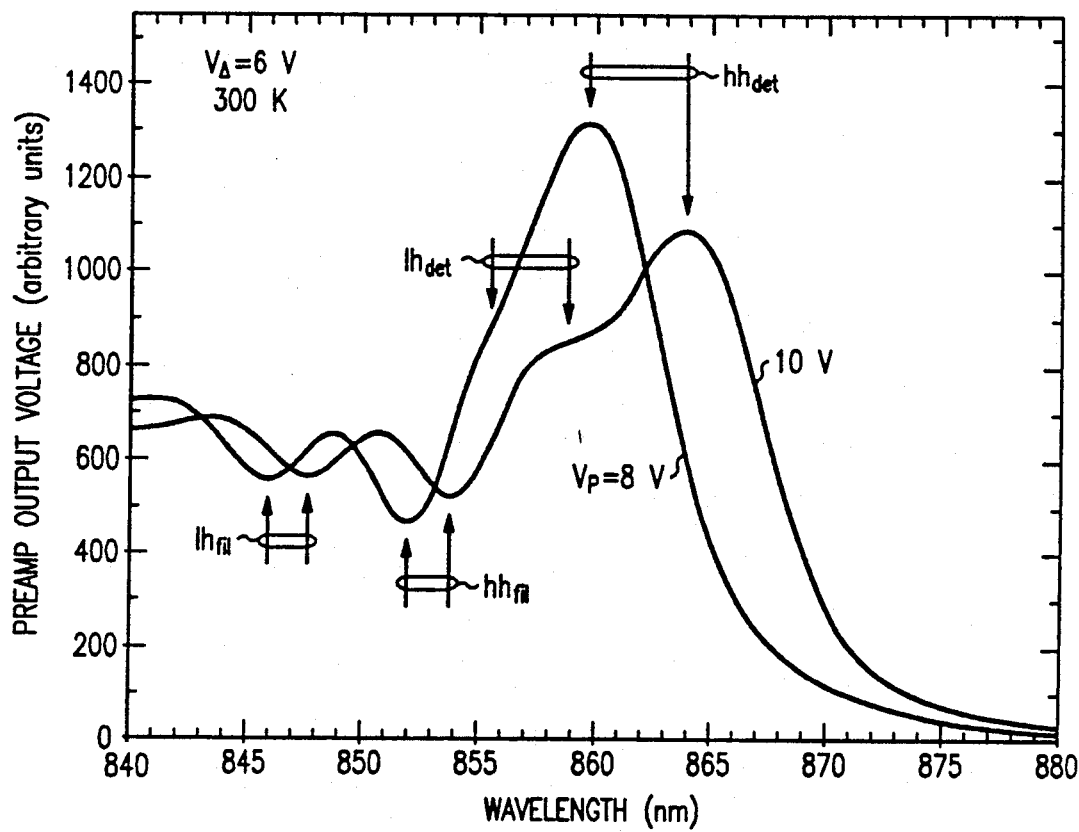
FIG. 2 is a graph of the photodetector output (preamp output voltage) of FIG. 1 versus incident light wavelength when the fixed voltage bias $V_A = 6$ volts and the variable voltage bias $V_P = 8$, 10 volts.

FIG. 2 is a graph showing the photodetector output 26, i.e., preamp output voltage, versus wavelength of incident light 12 with the fixed voltage bias $V_\Delta$ set at about 6 volts and the variable voltage bias $V_P$ set at about 8 volts and at about 10 volts during separate trials. The spectrum of FIG. 2 was generated by applying an unfocused light source over the mesa configuration. The heavy hole (hh) and light hole (lh) excitons of the MQW detector means 16 show up as peaks in the spectrum, while the heavy hole and light hole excitons of the MQW filter means 14 show up as dips. Thus, as can be seen from the graph of FIG. 2, the peak-to-valley ratio of the detector peaks compared to the remainder of the spectrum is enhanced dramatically.

Figure 3:
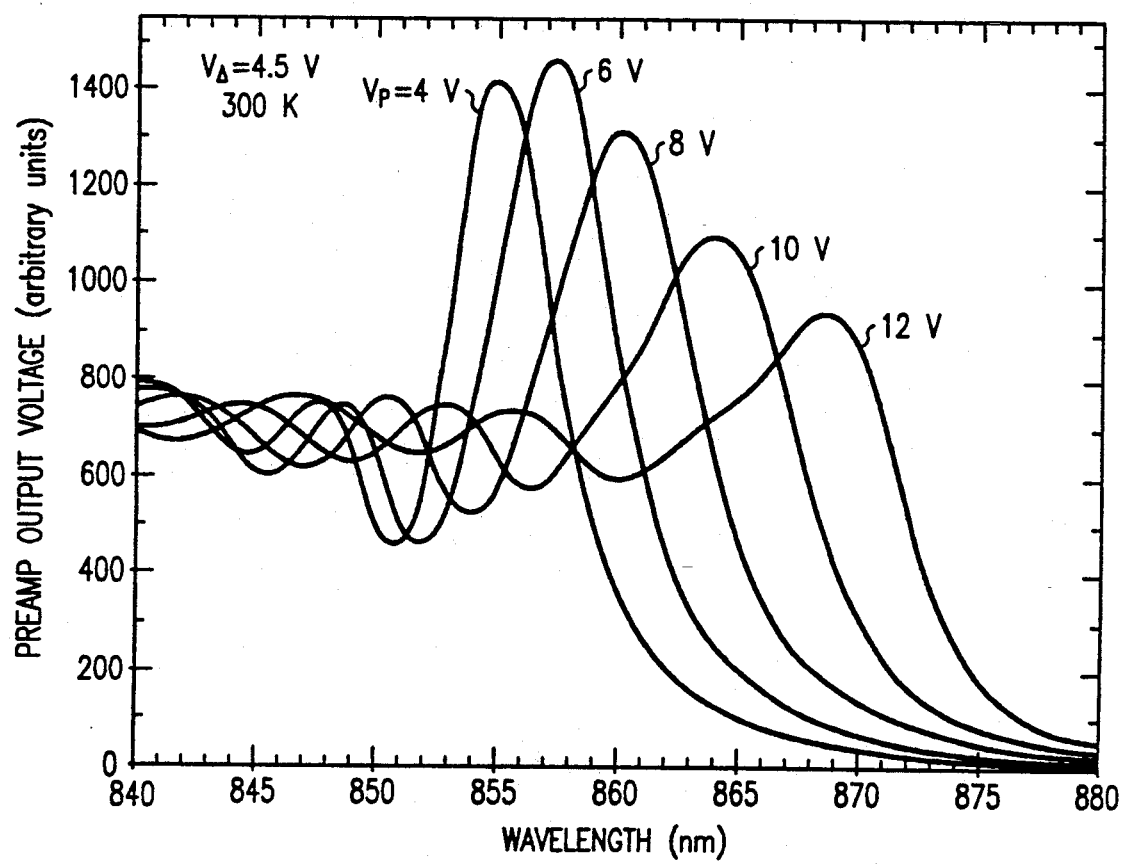
FIG. 3 is a graph of the photodetector output of FIG. 1 versus incident light wavelength when the fixed voltage bias $V_A = 4.5$ volts and the variable voltage bias $V_P = 4, 6, 8, 10, 12$ volts.

FIG. 3 is a graph of the photodetector output 26 versus wavelength of incident light 12 with the fixed voltage bias $V_\Delta$ set at about 4.5 volts and the variable voltage bias $V_P$ set at about 4, 6, 8, 10 and 12 volts on separate trials. The difference between the red shifts of the detector means 16 and the filter means 14 are smaller than in FIG. 2, giving a more distinguished single peak for wavelength. At this setting, the heavy hole exciton of the MQW filter means 14 lies approximately on the light hole exciton of the MQW detector means 16, thus having maximum effect at removing signals at wavelengths other than at the wavelength of the heavy hole exciton of the MQW detector means 16. With these settings, a tuning range of at least approximately 14 nm is achieved.

To further enhance the single peak response, a fixed filter 27, denoted by phantom lines in FIG. 1, may be employed to filter the incident light 12. Preferably, the fixed filter 27 eliminates all wavelengths of light outside of the tunable range of the photodetector 10. For this purpose, a suitable fixed filter 27 is a model RG.850 filter manufactured by and commercially available from Newport, Inc., Calif., U.S.A. The RG.850 filter exhibits greater than 95% transmission for light with wavelengths longer than 900 nm, and decreases to less than about 0.1% transmission for light with wavelengths less than 800 nm with a smooth transition thereinbetween.

Figure 4:
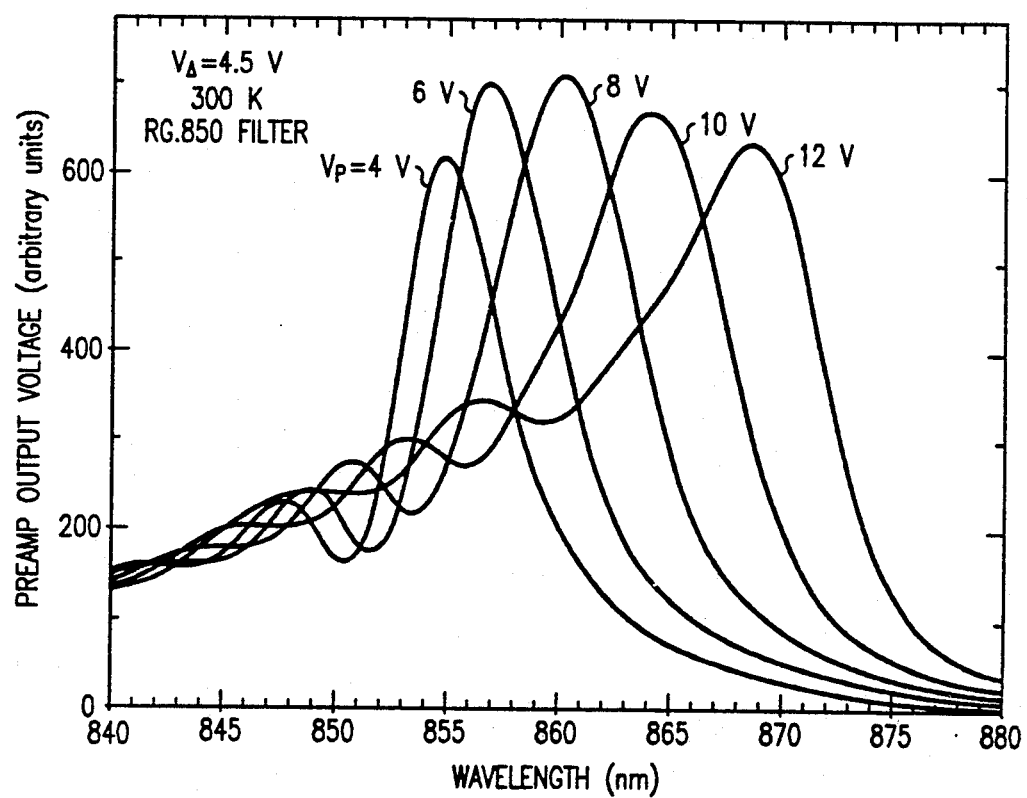
FIG. 4 is a graph of the photodetector output of FIG. 1 versus incident light wavelength when the fixed voltage bias $V_A = 4.5$ volts, the variable voltage bias $V_P = 4, 6, 8, 10, 12$ volts, and the incident light is filtered via a conventional fixed filter.

FIG. 4 shows the photodetector output 26 versus wavelength of incident light 12 with the fixed voltage bias $V_A$ set at about 4.5 volts, the variable voltage bias $V_P$ set at about 4, 6, 8, 10, and 12 volts during separate trials, and the fixed filter 27. The fixed filter 27 achieves very good selectivity, and the maximum voltage response is fairly constant as a function of the variable voltage bias $V_P$. The ratio of the maximum response for $V_P$ at 869 nm in FIG. 4 to the response in the spurious peak for the photodetector output 26 at 857 nm is about 1.9 to 1. Because this spurious peak is about the maximum response position of the $V_P$ equal 4 volt curve, this ratio is a good measure of the wavelength selectivity of the photodetector 10.

It is envisioned that a plurality of the photodetectors 10 of FIG. 1 may be situated in a two dimensional array for spectroscopy and imaging applications. In this application, each of the photodetectors 10 would detect a particular element of an image exposed to the array.

It will be obvious to those skilled in the art that many variations and modifications may be made to the preferred embodiment without substantially departing from the spirit and scope of the present invention. Accordingly, all such variations and modifications are intended to be included herein within the scope of the present invention.

Wherefore, the following is claimed:

1. A tunable monolithic integrated photodetector for determining a wavelength of incident light, comprising:
    a filter means for receiving and filtering the incident light, said filter means comprising an intrinsic first multiple quantum well material having first and second filter surfaces;
    a detector means for receiving light from said filter means and for exhibiting a peak photocurrent when the incident light exhibits a selected wavelength, said detector means comprising an intrinsic second multiple quantum well material having first and second detector surfaces;
    a variable voltage source with variable voltage positive and negative terminals, said variable voltage negative terminal being connected to said second filter surface and to said first detectors surface, said variable voltage source being adapted to apply a variable bias between said variable voltage positive and negative terminals, said variable bias being capable of adjustment for tuning and specifying the selected wavelength; and
    a fixed voltage source with fixed voltage positive and negative terminals, said fixed voltage negative terminal being connected to said first filter surface, said fixed voltage positive terminal being connected to said variable voltage positive terminal, said fixed and variable voltage sources and said filter means together forming a series circuit loop for permitting substantially resistance free current flow through said filter means and said fixed and variable voltage sources, said fixed voltage source applying a fixed bias between said fixed voltage positive and negative terminals for causing said filter means to absorb light wavelengths shorter than the selected wavelength to thereby enhance the detectability of the peak photocurrent in said detector means,
    whereby the wavelength of the incident light is identified by monitoring said detector means for the peak photocurrent while said variable bias is adjusted.

2. The photodetector of claim 1, further comprising a means for measuring an electrical characteristic between said variable voltage positive terminal and said second detector surface, said electrical characteristic for indicating the peak photocurrent in said detector means.

3. The photodetector of claim 1, wherein said first multiple quantum well layer is superposed on said second multiple quantum well layer which is superposed on a substrate.

4. The photodetector of claim 1, further comprising a fixed filter for eliminating wavelengths of said incident light prior to contact with said first multiple quantum well layer.

5. The photodetector of claim 1, further comprising a plurality of photodetectors associated with said photodetector to form an array.

6. The photodetector of claim 1, further comprising a doped layer interposed between said second filter surface and said first detector surface, and an open well through said first multiple quantum well layer to said doped layer, said well comprising an electrical contact contiguous with said doped layer for connecting said variable voltage negative terminal to said doped layer.

7. The photodetector of claim 1, wherein said intrinsic first multiple quantum well material comprises less periods than said second multiple quantum well material.

8. The photodetector of claim 1, wherein a first voltage is imposed across said first multiple quantum well material and a second voltage is imposed across said second multiple quantum well material as a result of said fixed and variable biases in combination, said first voltage being less than said second voltage.

9. The photodetector of claim 2, wherein said means for measuring comprises a current amplifier for converting current flow between said variable voltage positive terminal and said second detector surface to an output voltage, said output voltage for indicating the peak photocurrent in said detector means.

10. The photodetector of claim 3, further comprising a respective doped layer on said first multiple quantum well layer for receiving said incident light, between said first and second multiple quantum well layers, and between said second multiple quantum well layer and said substrate.

11. A tunable monolithic integrated photodetector for determining a wavelength of incident light, comprising:
   a filter means for receiving and filtering the incident light, said filter means comprising an intrinsic first multiple quantum well material;
   a detector means for receiving light from said filter means and for exhibiting a peak photocurrent when the incident light exhibits a selected wavelength, said detector means comprising an intrinsic second multiple quantum well material;
   a detector voltage source for applying a detector bias across said detector means, said detector bias capable of adjustment for tuning and specifying the selected wavelength; and
   a filter voltage source for applying a filter bias across said filter means, said filter voltage source being connected in series with said filter means for permitting current flow through said filter means and said bias means without resistance, said filter bias for causing said filter means to absorb light wavelengths shorter than the selected wavelength to thereby enhance the detectability of the peak photocurrent in said detector means,
   whereby the wavelength of the incident light is identified by detecting the peak photocurrent through said detector means during the adjustment of said detector bias.

12. The photodetector of claim 11, wherein said first multiple quantum well material comprises first and second filter surfaces and said second multiple quantum well material comprises first and second detector surfaces, wherein said detector voltage source comprises detector voltage positive and negative terminals and said filter voltage source comprises filter voltage positive and negative terminals, wherein said detector voltage negative terminal is connected to said second filter surface and to said first detector surface, and wherein said filter voltage negative terminal is connected to said first filter surface and said filter voltage positive terminal is connected to said detector voltage positive terminal.

13. The photodetector of claim 11, wherein said first multiple quantum well layer is superposed on said second multiple quantum well layer which is superposed on a substrate.

14. The photodetector of claim 11, further comprising a fixed filter for eliminating wavelengths of said incident light which are outside said range of said photodetector.

15. The photodetector of claim 11, further comprising a plurality of photodetectors forming an array.

16. The photodetector of claim 11, further comprising a doped layer interposed between said second filter surface and said first detector surface, and an open well through said first multiple quantum well layer to said doped layer, said well comprising an electrical contact on said doped layer for connecting said variable voltage negative terminal.

17. The photodetector of claim 11, wherein said intrinsic first multiple quantum well material comprises less periods than said second multiple quantum well material.

18. The photodetector of claim 11, wherein a first voltage is imposed across said first multiple quantum well material and a second voltage is imposed across said second multiple quantum well material as a result of said fixed and variable biases in combination, said first voltage being less than said second voltage.

19. The photodetector of claim 12, further comprising means for measuring an electrical characteristic between said detector voltage positive terminal and said second detector surface, said electrical characteristic for indicating the peak photocurrent in said detector means.

20. The photodetector of claim 13, further comprising a respective doped layer on said first multiple quantum well layer for receiving said incident light, between said first and second multiple quantum well layers, and between said second multiple quantum well layer and said substrate.

21. The photodetector of claim 19, wherein said means for measuring comprises a current amplifier for converting current flow between said variable voltage positive terminal and said second detector surface to an output voltage, said output voltage for indicating the peak photocurrent in said detector means.

22. A method of identifying a wavelength of light with a monolithic integrated structure having an intrinsic first multiple quantum well layer for receiving incident light and an intrinsic second multiple quantum well layer for receiving light from said first multiple quantum well layer, the second multiple quantum well layer for exhibiting a peak photocurrent when the incident light exhibits a selected wavelength, the method comprising the steps of:
   applying first and second voltage biases across said first and second multiple quantum well layers, respectively;
   adjusting said first voltage bias to cause said second multiple quantum well layer to absorb light wavelengths shorter than the selected wavelength thereby to enhance the detectability of the peak photocurrent;
   varying said second voltage bias to tune and specify the selected wavelength; and
   permitting current flow through said first multiple quantum well and around a series circuit loop which is free of resistance elements.

23. The method of claim 22, further comprising the step of filtering out wavelengths from the incident light prior to contacting said first multiple quantum well layer, thereby enhancing the detectability of the selected wavelength.

* * * * *